(12) United States Patent
Koike

(10) Patent No.: US 8,659,060 B2
(45) Date of Patent: Feb. 25, 2014

(54) SOLID-STATE IMAGING DEVICE AND MANUFACTURING METHOD THEREOF

(75) Inventor: Hidetoshi Koike, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 45 days.

(21) Appl. No.: 13/419,553

(22) Filed: Mar. 14, 2012

(65) Prior Publication Data

US 2012/0275480 A1  Nov. 1, 2012

(30) Foreign Application Priority Data

Apr. 26, 2011  (JP) ................................ 2011-098534

(51) Int. Cl.
*H01L 31/0224* (2006.01)
*H01L 21/00* (2006.01)

(52) U.S. Cl.
USPC .................. 257/292; 257/443; 257/E31.124; 438/75

(58) Field of Classification Search
USPC ..................... 257/292, 443, E31.124; 438/75
See application file for complete search history.

(56) References Cited

U.S. PATENT DOCUMENTS

| | | | |
|---|---|---|---|
| 6,777,729 B1* | 8/2004 | Prince et al. | 257/292 |
| 8,456,014 B2* | 6/2013 | Kobayashi et al. | 257/774 |
| 2006/0192083 A1* | 8/2006 | Fu et al. | 250/214.1 |
| 2007/0020791 A1* | 1/2007 | Hsu et al. | 438/22 |
| 2007/0045511 A1* | 3/2007 | Lee et al. | 250/208.1 |
| 2009/0309144 A1* | 12/2009 | Park et al. | 257/292 |
| 2010/0155796 A1 | 6/2010 | Koike et al. | |
| 2010/0237452 A1* | 9/2010 | Hagiwara et al. | 257/432 |
| 2011/0260221 A1* | 10/2011 | Mao et al. | 257/291 |

FOREIGN PATENT DOCUMENTS

| | | |
|---|---|---|
| JP | 2010-219425 | 9/2010 |
| KR | 10-2009-0033636 A | 4/2009 |
| KR | 10-2010-0050330 A | 5/2010 |

OTHER PUBLICATIONS

Korean Office Action issued May 20, 2013 in Patent Application No. 10-2012-0025506 with English Translation.

* cited by examiner

*Primary Examiner* — Steven J Fulk
(74) *Attorney, Agent, or Firm* — Oblon, Spivak, McClelland, Maier & Neustadt, L.L.P.

(57) ABSTRACT

According to one embodiment, a solid-state imaging device includes a semiconductor layer including first and second regions, a pixel portion provided in the first region, electrodes provided in the second region and configured to penetrate the semiconductor layer, and a guard ring provided in the second region and configured to penetrate the semiconductor layer and electrically isolate the pixel portion from the electrodes. An upper surface of the semiconductor layer in the second region is lower than an upper surface of the semiconductor layer in the first region.

13 Claims, 15 Drawing Sheets

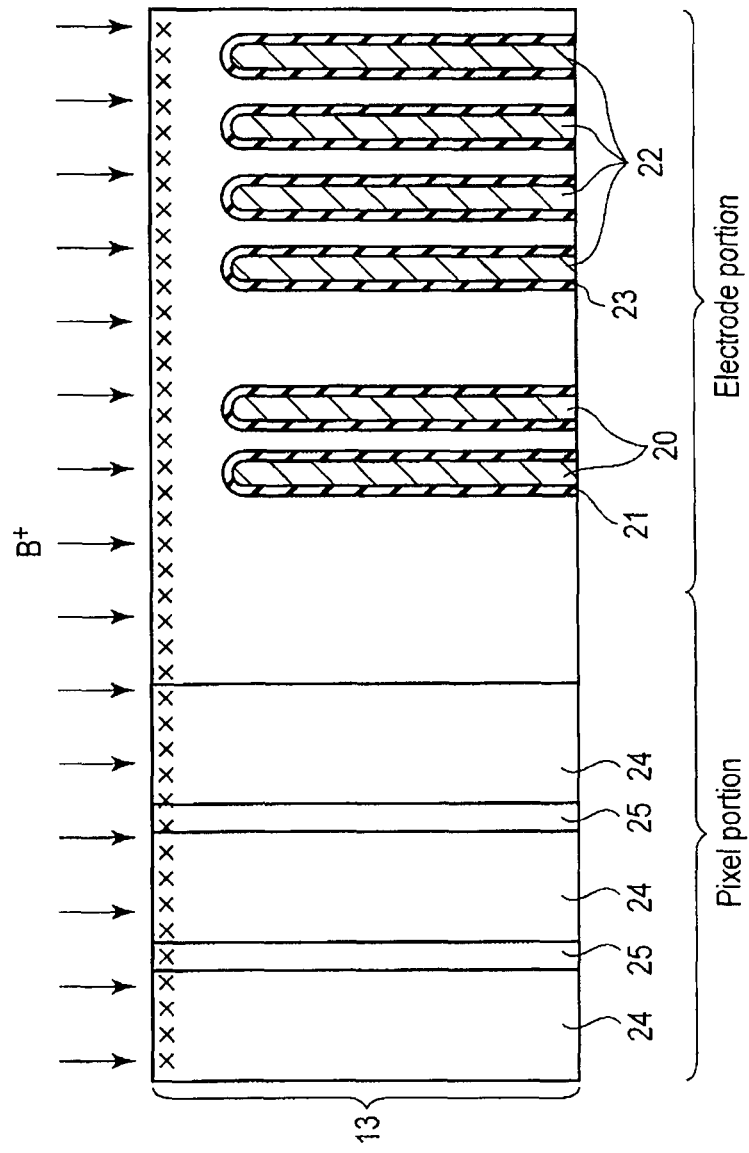
F I G. 8

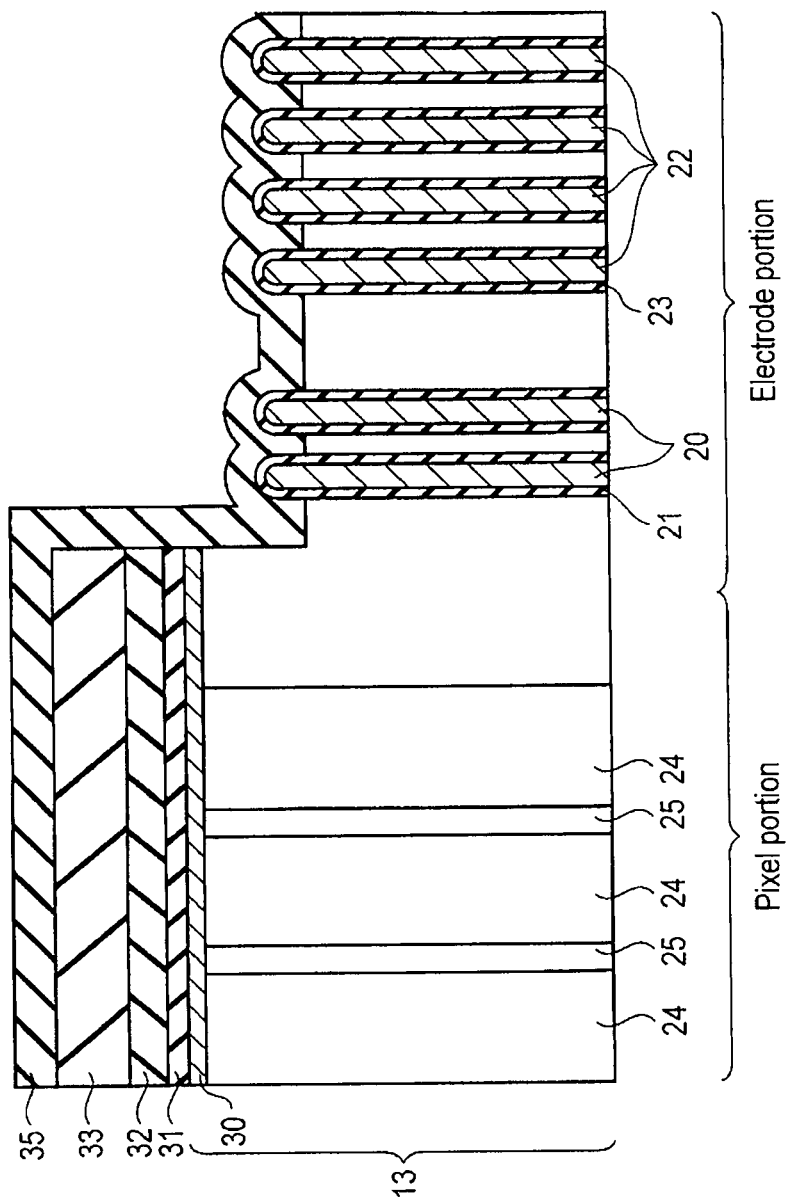
F I G. 13

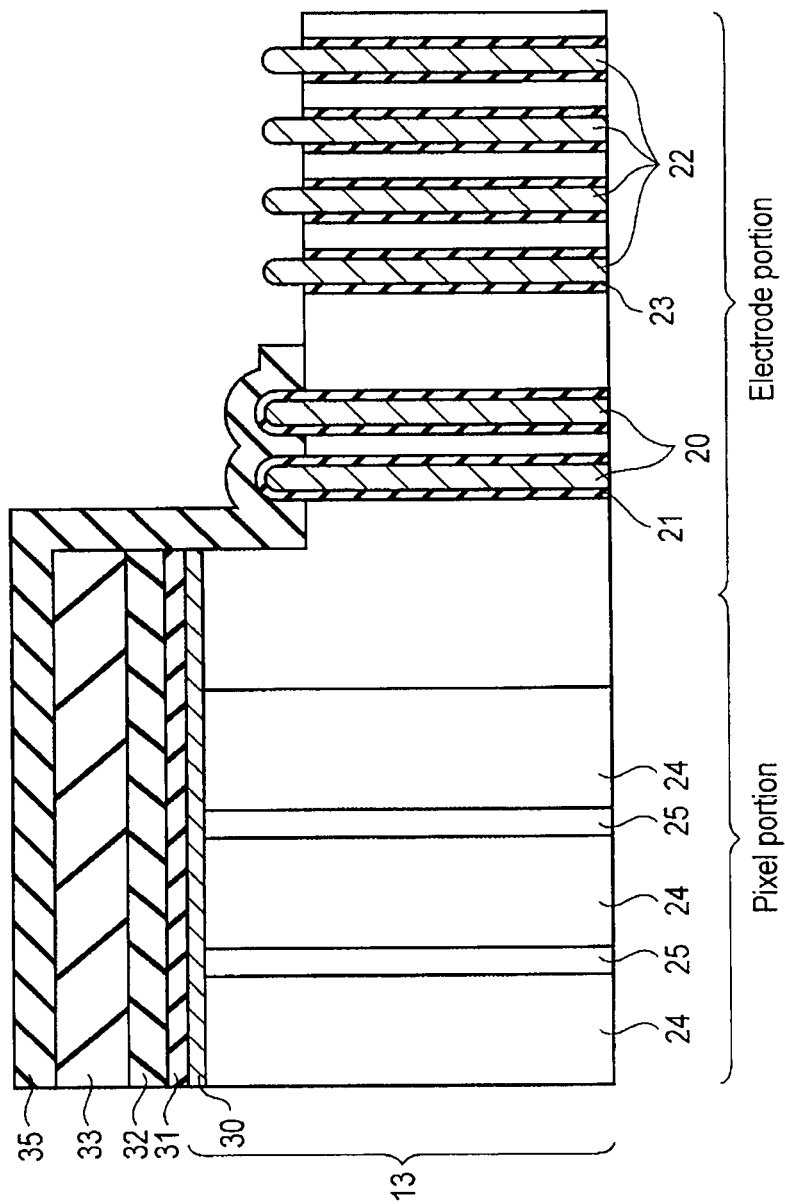
F I G. 15

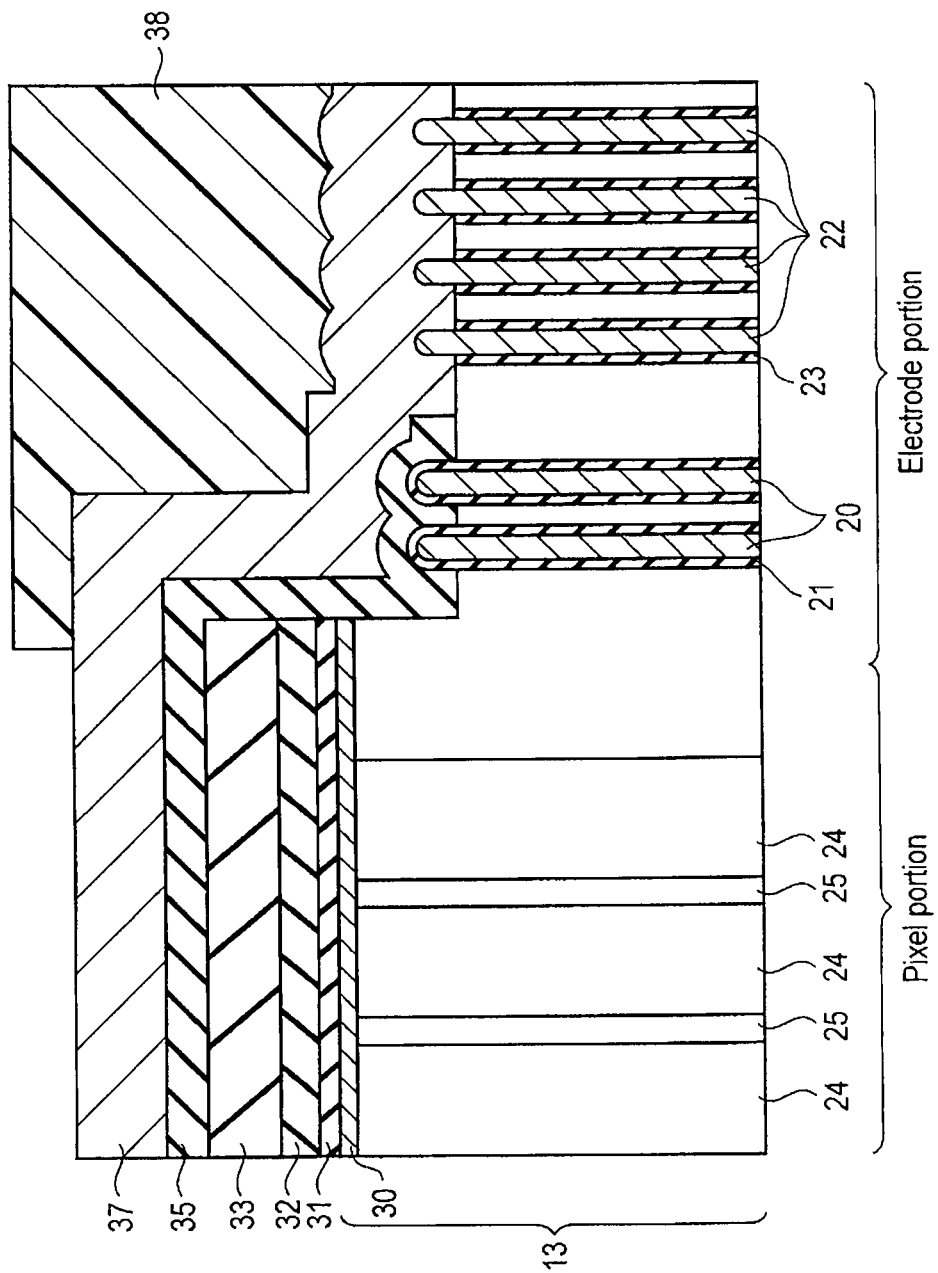
F I G. 17

SOLID-STATE IMAGING DEVICE AND MANUFACTURING METHOD THEREOF

CROSS-REFERENCE TO RELATED APPLICATIONS

This application is based upon and claims the benefit of priority from prior Japanese Patent Application No. 2011-098534, filed Apr. 26, 2011, the entire contents of which are incorporated herein by reference.

FIELD

Embodiments described herein relate generally to a solid-state imaging device and a manufacturing method thereof.

BACKGROUND

In a solid-state imaging device such as a CMOS image sensor, along with the reduction in the pixel size, use is sometimes made of a backside illumination structure, which ensures sufficient light is made incident on the photodiode. The backside illumination structure is a structure in which incident light from a subject is applied to a surface opposite to the front surface of a semiconductor substrate on which circuit elements such as transistors are formed, that is, a back surface of the semiconductor substrate. Since a backside illumination type solid-state imaging device is mounted while the back surface of the semiconductor substrate that is a light illumination surface is set up, it becomes necessary to form external terminals on the backside of the semiconductor substrate. Therefore, through electrodes are formed on the semiconductor substrate to penetrate the same and wirings or electrodes formed on the front surface side of the semiconductor substrate are electrically connected to the external terminals on the backside via the through electrodes.

For example, in order to prevent a leak current between an electrode portion including through electrodes and a pixel portion and noise from the electrode portion, a guard ring that electrically isolates the electrode portion and the pixel portion from each other is formed. However, electrical isolation between the electrode portion and the pixel portion becomes insufficient in some cases depending on the formation method of the guard ring. In this case, a leak current may flow via a P-type semiconductor layer on the backside of the semiconductor substrate between the inner portion and outer portion of the guard ring. Therefore, a process for preventing occurrence of a leak current is strongly desired.

BRIEF DESCRIPTION OF THE DRAWINGS

FIG. 8 is a cross-sectional view showing a manufacturing step of the solid-state imaging device following after the step of FIG. 6;

FIG. 13 is a cross-sectional view showing a manufacturing step of the solid-state imaging device following after the step of FIG. 12;

FIG. 15 is a cross-sectional view showing a manufacturing step of the solid-state imaging device following after the step of FIG. 14;

FIG. 17 is a cross-sectional view showing a manufacturing step of the solid-state imaging device following after the step of FIG. 16;

DETAILED DESCRIPTION

Figure 1:
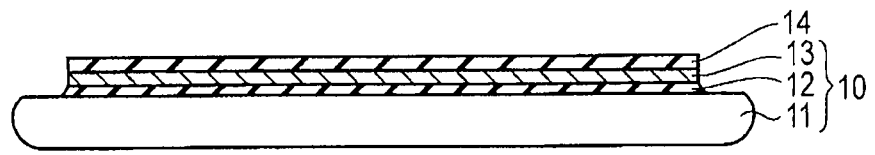
FIG. 1 is a cross-sectional view showing a manufacturing step of a solid-state imaging device according to the present embodiment.

In general, according to one embodiment, there is provided a solid-state imaging device comprising:
a semiconductor layer including first and second regions;
a pixel portion provided in the first region;
electrodes provided in the second region and configured to penetrate the semiconductor layer; and
a guard ring provided in the second region and configured to penetrate the semiconductor layer and electrically isolate the pixel portion from the electrodes,
wherein an upper surface of the semiconductor layer in the second region is lower than an upper surface of the semiconductor layer in the first region.

The embodiments will be described hereinafter with reference to the accompanying drawings. In the description which follows, the same or functionally equivalent elements are denoted by the same reference numerals, to thereby simplify the description.

The manufacturing method and the structure of a solid-state imaging device 1 according to the present embodiment are explained below with reference to the drawings. The solid-state imaging device 1 of this embodiment has a backside illumination structure.

FIG. 1 is a cross-sectional view showing the manufacturing step of the solid-state imaging device 1 according to the present embodiment. First, an SOI (Silicon On Insulator) substrate 10 is prepared. The SOI substrate 10 is configured by sequentially laminating a substrate 11, insulating layer 12 and semiconductor layer 13. As the substrate 11, for example, a silicon (Si) substrate is used. As the insulating layer 12, for example, a silicon oxide layer is used. As the semiconductor layer 13, for example, an epitaxial layer formed of silicon (Si) is used.

Then, various elements used to realize a function of the solid-state imaging device 1 are formed on the semiconductor layer 13. Specifically, pixels, electrodes, guard rings and the like are formed on the semiconductor layer 13. The structures of the pixels, electrodes and guard rings formed on the semiconductor layer 13 are described later.

Next, a wiring structure 14 electrically connected to the elements formed on the semiconductor layer 13 is formed on the semiconductor layer 13. The wiring structure 14 is formed of a multi-layered wiring layer and interlayer insulating layer. Then, the side surfaces of the semiconductor layer 13 and wiring structure 14 are trimmed to make the outer peripheries of the semiconductor layer 13 and wiring structure 14 smaller than the outer periphery of the substrate 11.

Figure 2:
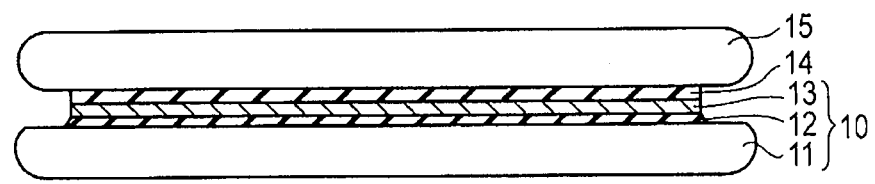
FIG. 2 is a cross-sectional view showing a manufacturing step of the solid-state imaging device following after the step of FIG. 1.

Next, as shown in FIG. 2, the wiring structure 14 and a supporting substrate 15 are bonded together after the interlayer insulating layer that is the uppermost layer of the wiring structure 14 is made flat. The supporting substrate 15 has a function of increasing the strength of the solid-state imaging device 1.

Figure 3:
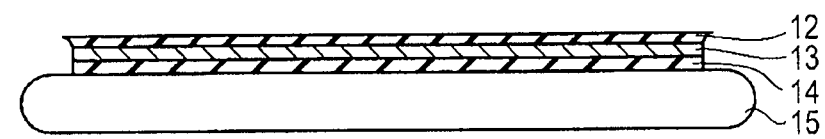
FIG. 3 is a cross-sectional view showing a manufacturing step of the solid-state imaging device following after the step of FIG. 2.

Subsequently, as shown in FIG. 3, the SOI substrate 10 is turned over. In this state, the back surface of the semiconductor layer 13 (a surface that contacts the insulating layer 12) is set on the upper side and the front surface of the semiconductor layer 13 (a surface that contacts the wiring structure 14) is set on the lower side. Then, the silicon substrate 11 is removed by using a CMP (Chemical Mechanical Polishing) method, for example.

Figure 4:
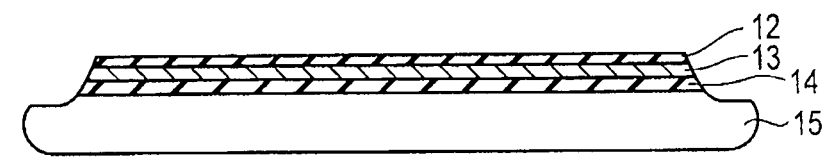
FIG. 4 is a cross-sectional view showing a manufacturing step of the solid-state imaging device following after the step of FIG. 3.

Next, as shown in FIG. 4, the insulating layer 12, semiconductor layer 13 and wiring structure 14 are trimmed into a desired shape. Further, as shown in FIG. 5, the insulating layer 12 is removed by using a wet etching method, for example, and the back surface of the semiconductor layer 13 is dug and lowered such that the back surface of the semiconductor layer 13 approaches the electrodes and guard rings.

Figure 5:
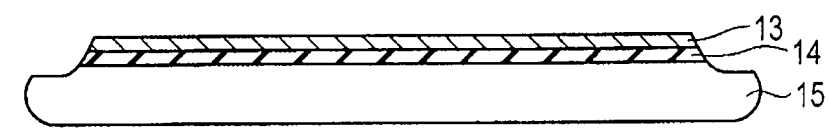
FIG. 5 is a cross-sectional view showing a manufacturing step of the solid-state imaging device following after the step of FIG. 4.
Figure 6:
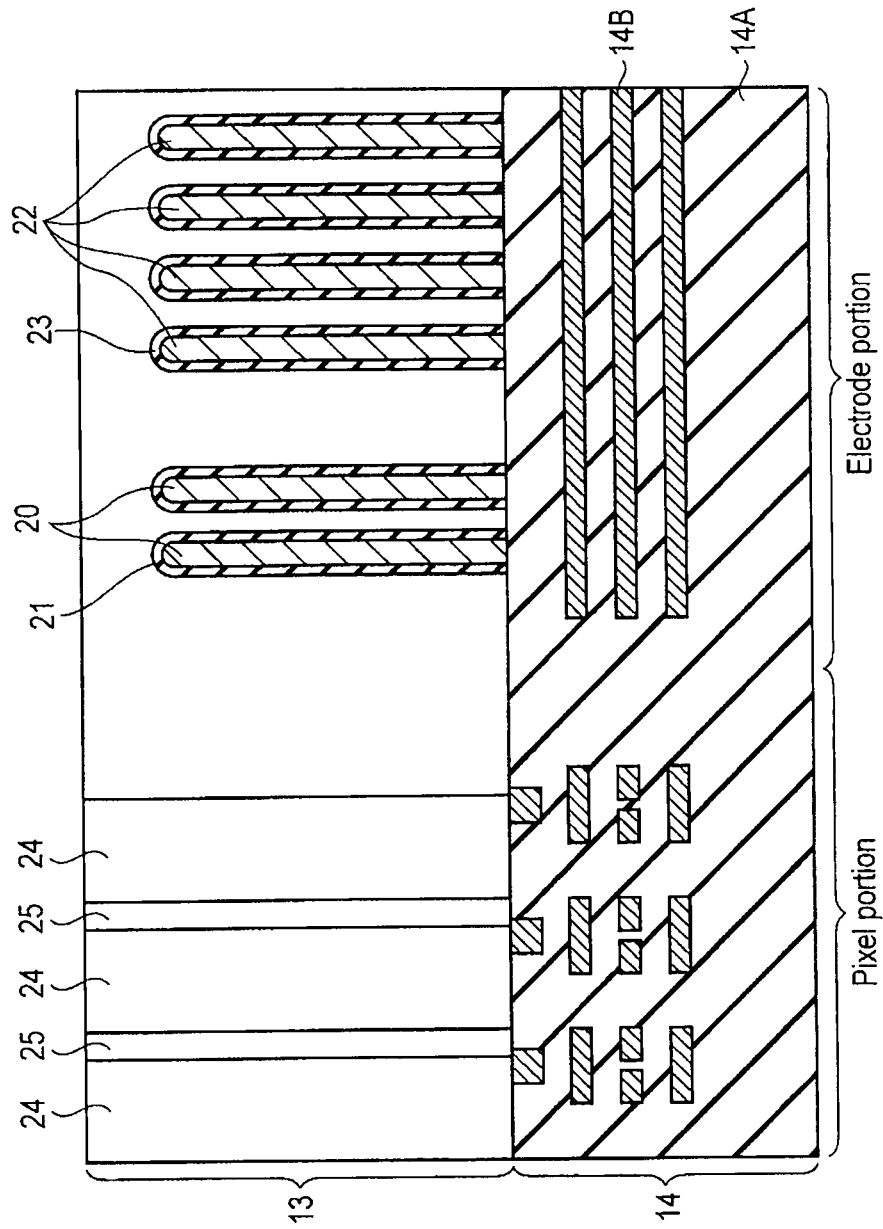
FIG. 6 is a cross-sectional view showing a manufacturing step of the solid-state imaging device following after the step of FIG. 5.

FIG. 6 is a cross-sectional view showing an extracted portion of the semiconductor layer 13 shown in FIG. 5. Like the case of FIG. 5, in FIG. 6, the back surface of the semiconductor layer 13 (exposed surface) is set on the upper side and the front surface of the semiconductor layer 13 (the surface that contacts the wiring structure 14) is set on the lower side. The thickness of the semiconductor layer 13 is approximately 2.8 μm, for example. The semiconductor layer 13 includes a pixel region in which a pixel portion is formed and an electrode region in which an electrode portion including electrodes 22 and guard rings 20 is formed. The wiring structure 14 includes multi-layered layers 14B including gate electrodes of MOS transistors and an interlayer insulating layer 14A that fills spaces between the multi-layered layers 14B.

Figure 7:
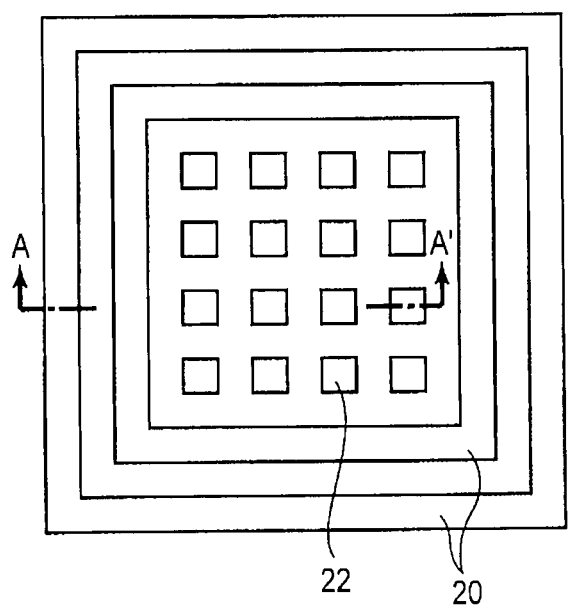
FIG. 7 is a layout view of electrodes and guard rings.

FIG. 7 is a layout view of the electrode portion including the electrodes 22 and guard rings 20. The cross section taken along the A-A' line of FIG. 7 corresponds to the electrode portion of FIG. 6. In the semiconductor layer 13, a plurality of electrodes 22 are provided. In FIG. 7, 4×4 electrodes 22 are shown as an example. Further, in the semiconductor layer 13, the guard rings 20 are formed to surround the electrodes 22.

As the electrodes 22 and guard rings 20, for example, conductive polysilicon is used. Each electrode 22 is covered with an insulating film 23 and electrically isolated from the semiconductor layer 13 by means of the insulating film 23. Likewise, each guard ring 20 is covered with an insulating film 21 and electrically isolated from the semiconductor layer 13 by means of the insulating film 21. As the insulating films 21, 23, for example, silicon nitride is used. The guard ring 20 is finally grounded and has a function of electrically isolating the electrodes 22 from the pixel portion.

The formation method of the electrodes 22 is performed by (1) forming trenches in the semiconductor layer 13 from the front surface side, (2) forming insulating films 23 in the trenches and (3) forming electrodes 22 on the internal portions of the insulating films 23 to fill the trenches. The above method is also applied to the formation method of the guard rings 20. The distance between the bottom surface of the trench and the back surface of the semiconductor layer 13 is approximately 0.4 μm, for example. The guard rings 20 and electrodes 22 are finally formed to penetrate (pass through) the semiconductor layer 13, but in the stage of the manufacturing step of FIG. 6, they are formed in the trenches formed in the semiconductor layer 13. That is, the through electrodes of this embodiment (guard rings 20 and electrodes 22) are formed by burying conductors covered with insulating films in the semiconductor substrate (semiconductor layer 13) and then making the semiconductor substrate thin.

In the pixel region of the semiconductor layer 13, a plurality of photodiodes respectively contained in a plurality of pixels are formed. Each photodiode 24 is formed of an n-type semiconductor region. The photodiodes 24 are electrically isolated from one another by means of an element isolation region 25. The element isolation region 25 is formed of a p-type semiconductor region. Further, the electrode region of the semiconductor layer 13 is also formed of a p-type semiconductor region like the element isolation region 25.

Figure 9:
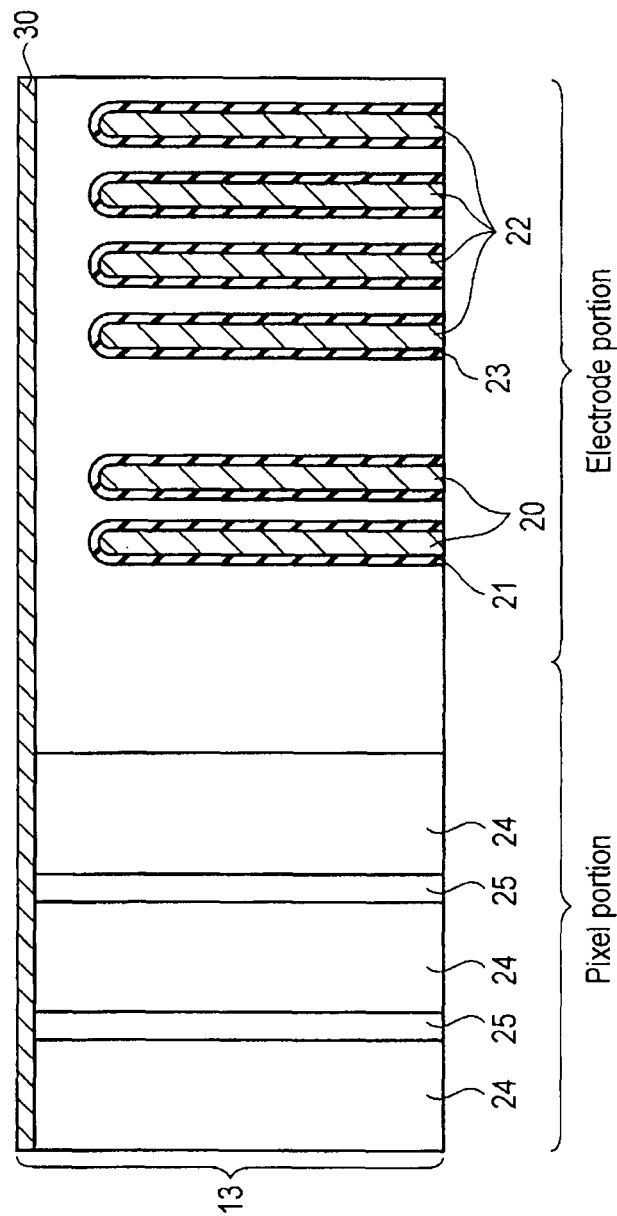
FIG. 9 is a cross-sectional view showing a manufacturing step of the solid-state imaging device following after the step of FIG. 8.

Next, as shown in FIG. 8, p-type impurities such as boron ($B^+$) of high concentration are ion-implanted into the backside region of the semiconductor layer 13. Then, the backside region of the semiconductor layer 13 is subjected to a laser annealing process. As a result, as shown in FIG. 9, a p-type semiconductor region 30 is formed on the backside region of the semiconductor layer 13. The thickness of the p-type semiconductor region 30 is approximately 0.15 μm, for example. The p-type semiconductor region 30 functions as a shield film that prevents charges stored in the photodiodes 24 from being discharged.

Figure 10:
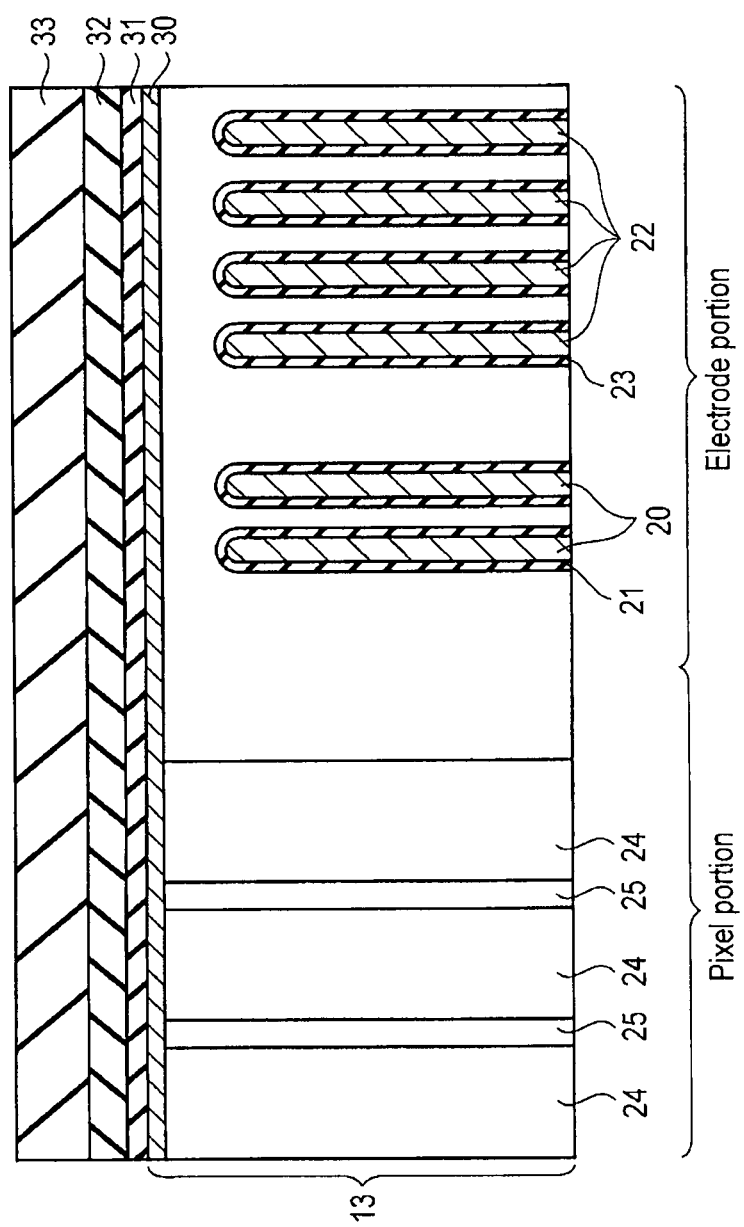
FIG. 10 is a cross-sectional view showing a manufacturing step of the solid-state imaging device following after the step of FIG. 9.

Next, as shown in FIG. 10, for example, an insulating film 31, anti-reflection film 32 and protection film 33 are sequentially deposited by use of a CVD (Chemical Vapor Deposition) method. The insulating film 31 is formed of a laminated film of a silicon oxide film and hafnium oxide film (HfO film). The thickness of the silicon oxide film is approximately 2 nm. The thickness of the hafnium oxide film is approximately 13 nm. Since the hafnium oxide film can store electrons, it functions as a fixed electrode film that urges holes to be stored in the p-type semiconductor region 30 formed in opposition to the hafnium oxide film with the silicon oxide film disposed therebetween. The shielding effect of the p-type semiconductor region 30 is enhanced due to the presence of the hafnium oxide film contained in the insulating film 31. As the anti-reflection film 32, for example, a silicon nitride film with a thickness of approximately 70 nm is used. As the protection film 33, for example, a silicon oxide film with a thickness of approximately 220 nm is used.

Figure 11:
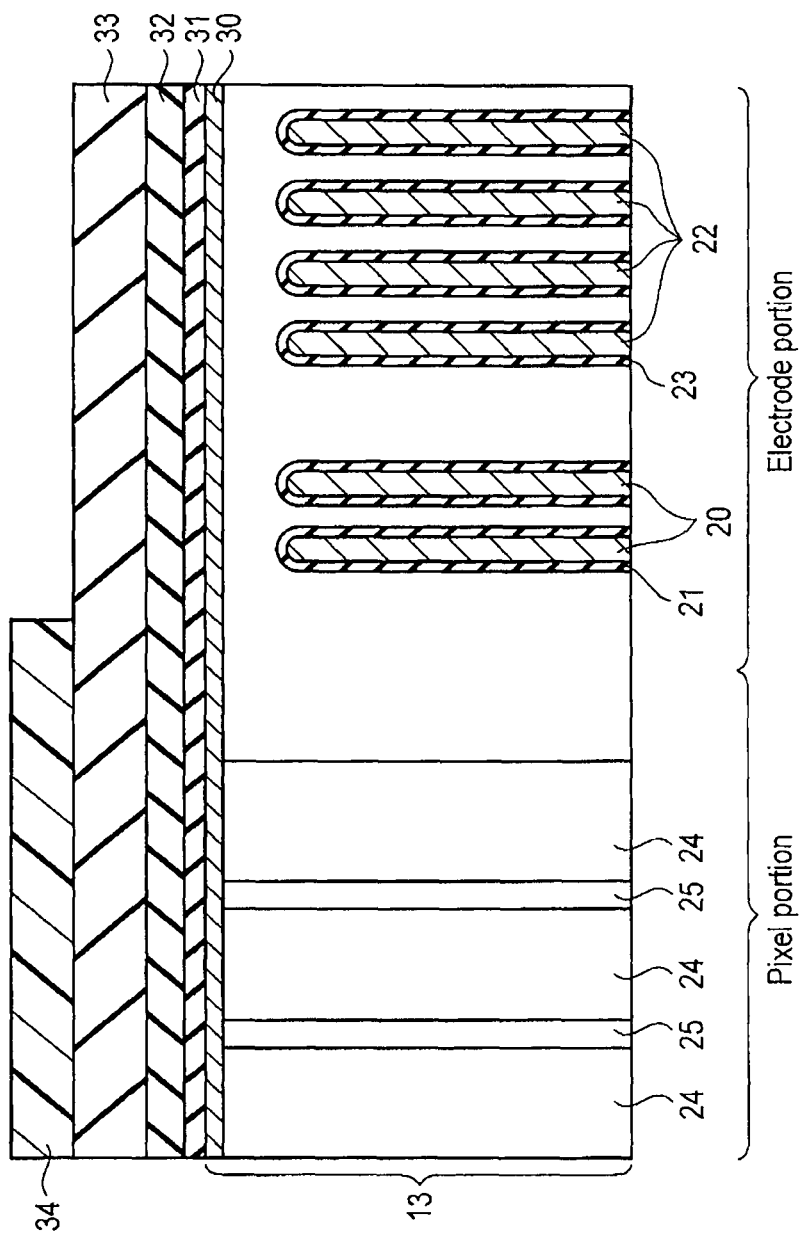
FIG. 11 is a cross-sectional view showing a manufacturing step of the solid-state imaging device following after the step of FIG. 10.

Then, as shown in FIG. 11, a resist 34 used for exposing only the electrode portion is formed on the protection film 33 by use of a lithography process.

Figure 12:
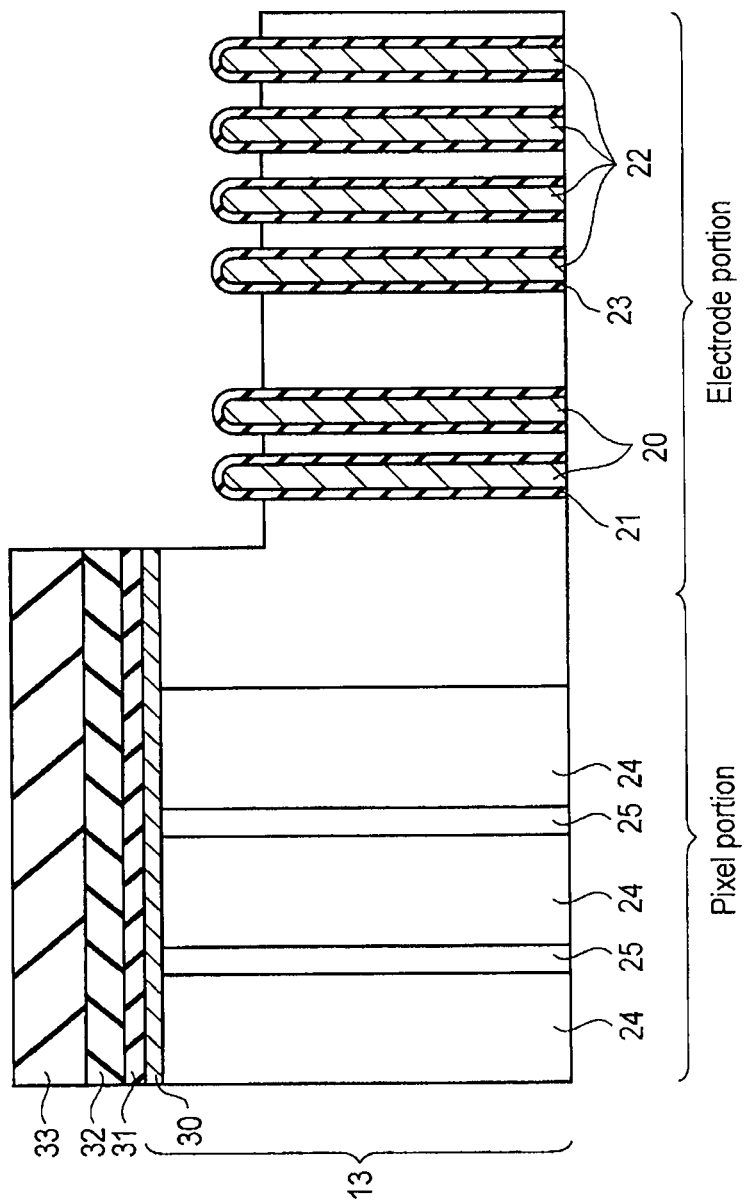
FIG. 12 is a cross-sectional view showing a manufacturing step of the solid-state imaging device following after the step of FIG. 11.

Next, as shown in FIG. 12, the protection film 33, anti-reflection film 32 and insulating film 31 are processed with the resist 34 used as a mask by using an RIE (Reactive Ion Etching) method, for example. Then, the resist 34 is removed. Subsequently, the exposed portions of the semiconductor layer 13 are dug to expose the upper portions of the guard rings 20 and electrodes 22 by use of a wet etching method. At this time, since the semiconductor layer 13 in the pixel portion is not etched, there occurs a step in the boundary portion between the pixel portion and the electrode portion on the back surface of the semiconductor layer 13. Further, the electrode 22 becomes a through electrode that penetrates the semiconductor layer 13. Likewise, the guard ring 20 penetrates the semiconductor layer 13. That is, the electrodes 22 and guard rings 20 protrude from the back surface of the semiconductor layer 13. As a result, the guard ring 20 can electrically isolate the pixel portion from the electrodes 22.

Figure 14:
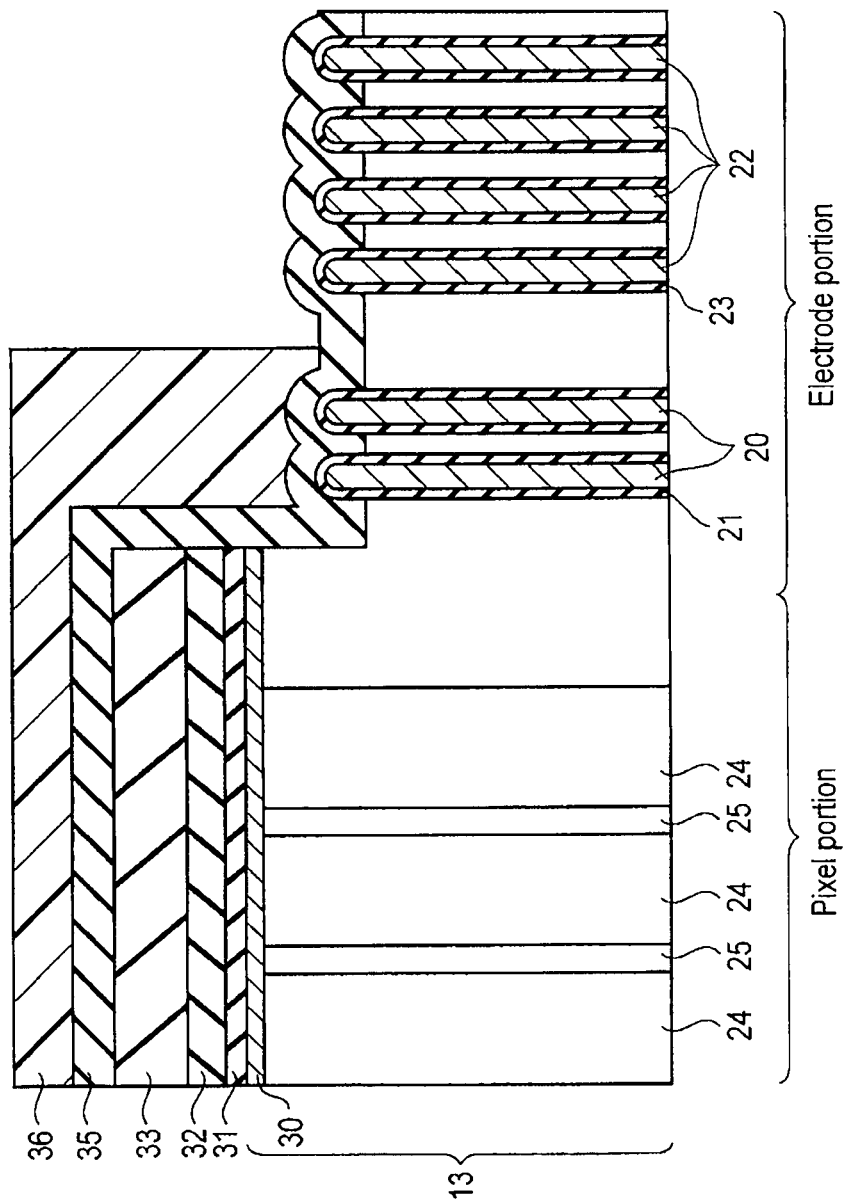
FIG. 14 is a cross-sectional view showing a manufacturing step of the solid-state imaging device following after the step of FIG. 13.

Next, as shown in FIG. 13, for example, an insulating film 35 is deposited on the entire surface of the device by use of the CVD method. As the insulating film 35, for example, a silicon nitride film with a thickness of approximately 70 nm is used. Then, as shown in FIG. 14, a resist 36 that covers the pixel portion and guard rings 20 is formed on the insulating film 35 by use of the lithography process.

Subsequently, as shown in FIG. 15, for example, the insulating film 35 is processed with the resist 36 used as a mask by use of the RIE method. In this case, the exposed portions of the insulating films 23 are etched in the RIE process to expose the upper portions of the electrodes 22. As a result, only the pixel portion and guard rings 20 are covered with the insulating film 35. After this, the resist 36 is removed.

Figure 16:
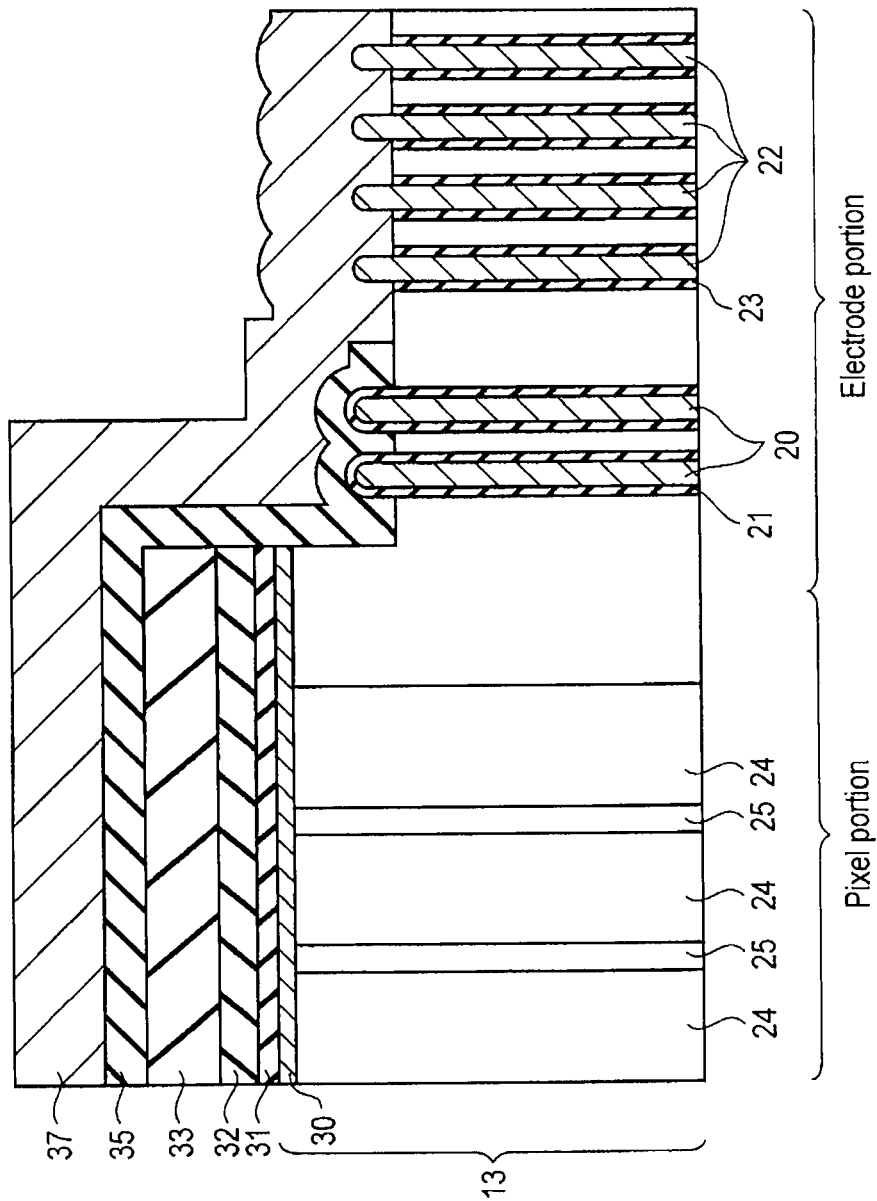
FIG. 16 is a cross-sectional view showing a manufacturing step of the solid-state imaging device following after the step of FIG. 15.

Next, as shown in FIG. 16, for example, a metal film 37 used to form a bonding pad is formed on the entire surface of the device by use of the sputtering method. As the metal film 37, for example, an aluminum (Al) film with a thickness of approximately 330 nm is used.

Then, as shown in FIG. 17, a resist 38 used to expose the pixel portion and having the same shape as the final shape of the bonding pad is formed on the metal film 37 by use of the lithography process.

Figure 18:
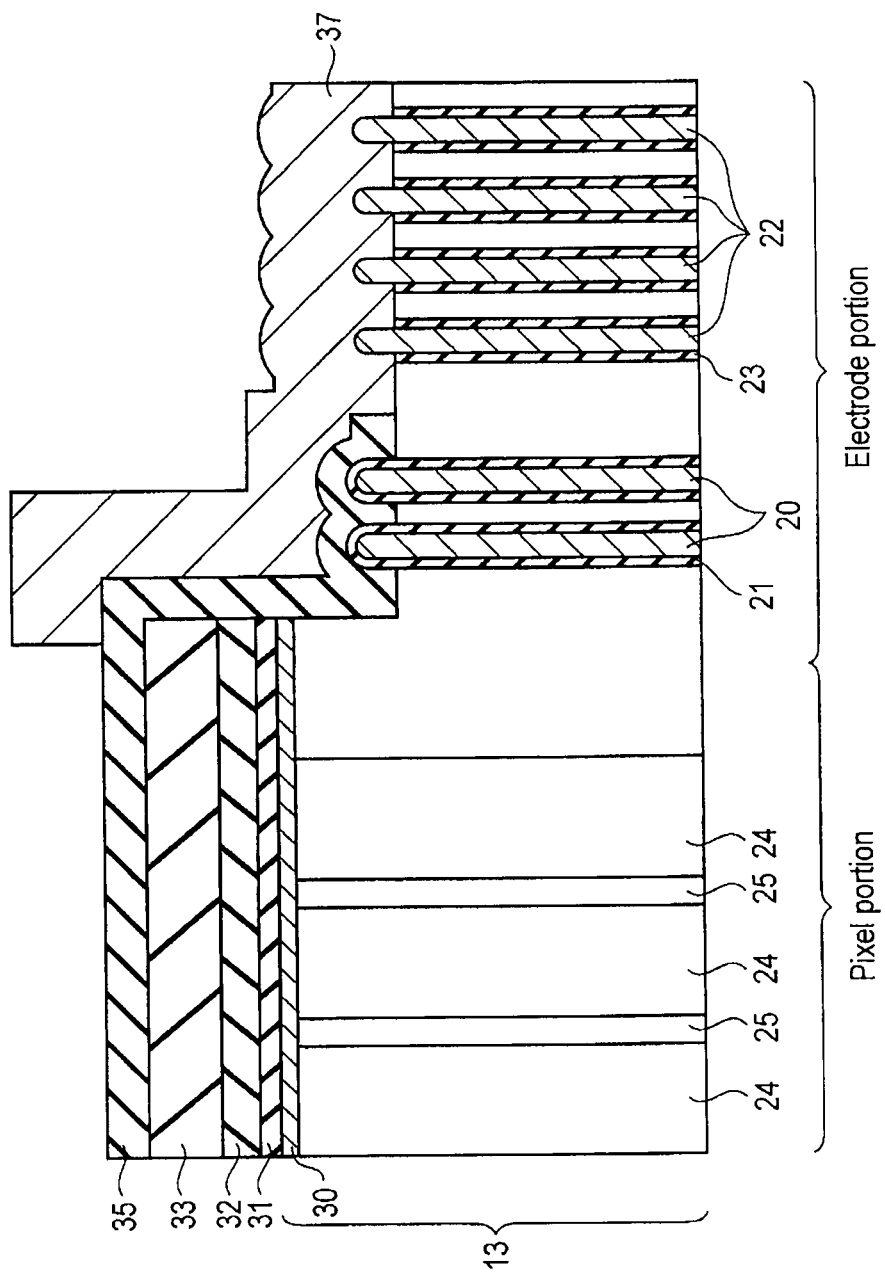
FIG. 18 is a cross-sectional view showing a manufacturing step of the solid-state imaging device following after the step of FIG. 17.

Next, as shown in FIG. 18, the metal film 37 is processed with the resist 38 used as a mask by use of the RIE method, for example. Thus, a bonding pad 37 electrically connected to the electrodes 22 is formed. After this, the resist 38 is removed.

Figure 19:
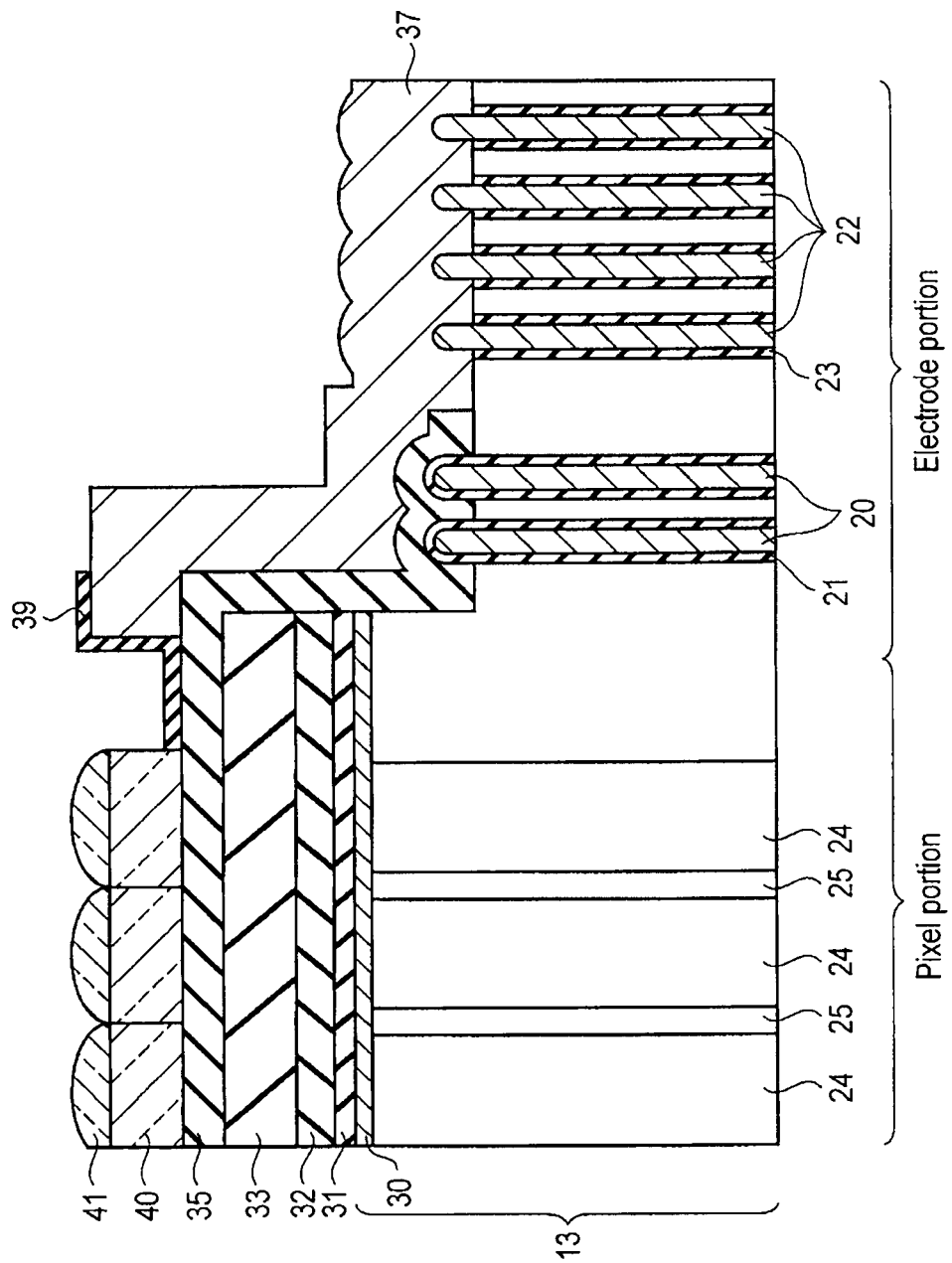
FIG. 19 is a cross-sectional view showing a manufacturing step of the solid-state imaging device following after the step of FIG. 18.

Subsequently, as shown in FIG. 19, a passivation film 39 that covers the electrode portion is formed to partly expose the bonding pad 37. As the passivation film 39, for example, a laminated film of a silicon oxide film and silicon nitride film is used. Then, a plurality of color filters 40 and a plurality of micro-lenses 41 are formed above the respective photodiodes 24.

With the above structure, the solid-state imaging device 1 of this embodiment can receive and detect incident light by making light incident from above in FIG. 19 and performing a photoelectric conversion process by means of the photodiodes 24. Since light is made incident from above the opposite side (back surface side) with respect to the side (front surface side) of the wiring structure 14 arranged in a lower portion as viewed from the semiconductor layer 13 having the photodiodes 24 formed therein, a backside illumination structure is configured. That is, the back surface of the semiconductor layer 13 is used as a light incident surface.

(Effect)

As described above, in this embodiment, the solid-state imaging device 1 includes the pixel portion formed in the first region of the semiconductor layer 13 and the electrode portion formed in the second region of the semiconductor layer 13. The electrode portion includes a plurality of electrodes 22 that penetrate the semiconductor layer 13 and guard rings 20 that penetrate the semiconductor layer 13 and electrically isolate the pixel portion from the electrodes 22. The back surface of the semiconductor layer 13 in the second region is set lower than the back surface of the semiconductor layer 13 in the first region. Further, the electrodes 22 and guard rings 20 are exposed on the backside of the semiconductor layer 13, the exposed guard rings 20 are covered with the insulating film 35 and the exposed electrodes 22 are covered with the bonding pad 37. In the manufacturing method of the solid-state imaging device, the guard rings 20 are covered with the insulating film 35 after a plurality of electrodes 22 and guard rings 20 are simultaneously exposed from the backside of the semiconductor layer 13.

Therefore, according to this embodiment, a leak current path can be prevented from being formed via the backside region of the semiconductor layer 13 between the inner side and the outer side of the guard ring 20. As a result, since the guard ring 20 can electrically isolate the pixel portion from the electrodes 22, a structure in which a leak current does not flow between the pixel portion and the electrodes 22 can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
a semiconductor layer including first and second regions;
a pixel portion provided in the first region;
electrodes provided in the second region and configured to penetrate the semiconductor layer; and
a guard ring provided in the second region and configured to penetrate the semiconductor layer and electrically isolate the pixel portion from the electrodes,
wherein an upper surface of the semiconductor layer in the second region is lower than an upper surface of the semiconductor layer in the first region, and
the upper surface of the semiconductor layer in the second region is lower than an upper surface of the guard ring and upper surfaces of the electrodes.

2. The device of claim 1, wherein the electrodes and the guard ring are exposed from the upper surface of the semiconductor layer.

3. The device of claim 1, wherein the electrodes and the guard ring are configured to protrude from the upper surface of the semiconductor layer.

4. The device of claim 1, further comprising:
an insulating film configured to cover an exposed portion of the guard ring; and
a conductive pad electrically connected to the electrodes.

5. The device of claim 1, wherein the guard ring is configured to surround the electrodes.

6. The device of claim 1, further comprising:
a first insulating film configured to cover each of the electrodes and electrically isolate the electrode from the semiconductor layer; and
a second insulating film configured to cover the guard ring and electrically isolate the guard ring from the semiconductor layer.

7. The device of claim 1, wherein the pixel portion includes a photodiode provided in the semiconductor layer, a color filter provided above the photodiode and a micro-lens provided on the color filter.

8. A manufacturing method of a solid-state imaging device, the method comprising:
    forming a pixel portion in a first region of a semiconductor layer;
    forming electrodes and a guard ring in a second region of the semiconductor layer, the guard ring being configured to electrically isolate the pixel portion from the electrodes, the electrodes and the guard ring being embedded from a first surface of the semiconductor layer;
    lowering a second surface of the semiconductor layer in the second region to expose end portions of the electrodes and the guard ring, an upper surface of the semiconductor layer in the second region being lower than an upper surface of the guard ring and upper surfaces of the electrodes;
    covering an exposed portion of the guard ring with a first insulating film; and
    forming a conductive pad electrically connected to the electrodes.

9. The method of claim 8, further comprising covering the semiconductor layer of the first region with a resist before the lowering the second surface of the semiconductor layer.

10. The method of claim 8, further comprising:
    forming a second insulating film that covers each of the electrodes and electrically isolates the electrode from the semiconductor layer; and
    forming a third insulating film that covers the guard ring and electrically isolates the guard ring from the semiconductor layer.

11. The method of claim 8, wherein the electrodes and the guard ring are configured to protrude from the second surface of the semiconductor layer.

12. The method of claim 8, wherein the guard ring is configured to surround the electrodes.

13. The method of claim 8, wherein the pixel portion includes a photodiode formed in the semiconductor layer, a color filter formed above the photodiode and a micro-lens formed on the color filter.

* * * * *